(12) United States Patent
Oggioni et al.

(10) Patent No.: US 11,251,160 B2
(45) Date of Patent: Feb. 15, 2022

(54) MANUFACTURING OF FLIP-CHIP ELECTRONIC DEVICE WITH CARRIER HAVING HEAT DISSIPATION ELEMENTS FREE OF SOLDER MASK

(71) Applicant: INTERNATIONAL BUSINESS MACHINES CORPORATION, Armonk, NY (US)

(72) Inventors: Stefano Oggioni, Milan (IT); Thomas Brunschwiler, Thalwil (CH); Gerd Schlottig, Uitikon Waldegg (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/944,212

(22) Filed: Jul. 31, 2020

(65) Prior Publication Data
US 2020/0357774 A1    Nov. 12, 2020

Related U.S. Application Data

(60) Division of application No. 16/145,321, filed on Sep. 28, 2018, now Pat. No. 10,886,254, which is a
(Continued)

(30) Foreign Application Priority Data

Dec. 4, 2013    (GB) ..................... 1321370

(51) Int. Cl.
*H01L 25/065*    (2006.01)
*H01L 23/36*    (2006.01)
(Continued)

(52) U.S. Cl.
CPC ...... *H01L 25/0657* (2013.01); *H01L 21/4871* (2013.01); *H01L 23/36* (2013.01);
(Continued)

(58) Field of Classification Search
CPC . H01L 25/0657; H01L 21/4871; H01L 23/36; H01L 23/367; H01L 23/49805;
(Continued)

(56) References Cited

U.S. PATENT DOCUMENTS

| | | |
|---|---|---|
| 4,967,313 A | 10/1990 | Berner |
| 5,390,078 A | 2/1995 | Taylor |

(Continued)

FOREIGN PATENT DOCUMENTS

| | | |
|---|---|---|
| CN | 101690434 A | 3/2010 |
| CN | 102543907 A | 7/2012 |

(Continued)

OTHER PUBLICATIONS

Oggioni et al., "List of IBM Patents and/or Patent Applications Treated as Related", U.S. Appl. No. 16/944,212, filed Jul. 31, 2020, dated Jul. 31, 2020 (2 pages).

*Primary Examiner* — David A Zarneke
(74) *Attorney, Agent, or Firm* — Tihon Poltavets, Esq.; Kevin P. Radigan, Esq.; Heslin Rothenberg Farley & Mesiti, P.C.

(57) ABSTRACT

Manufacturing of flip-chip type assemblies is provided, and includes forming one or more contact elements of electrically conductive material on a carrier surface of at least one chip carrier, providing a restrain structure around the contact elements, depositing solder material on the contact elements and/or on one or more terminals of electrically conductive material on a chip surface of at least one integrated circuit chip, and placing the chip with each terminal facing corresponding contact elements. Further, the method includes soldering each terminal to the corresponding contact element by a soldering material, the soldering material being restrained during a soldering of the terminals to the contact elements by the restrain structure, and forming one or more heat dissipation elements of thermally conductive material on the carrier surface for facing the chip surface displaced from the terminals, where the one or more heat dissipation elements are free of any solder mask.

11 Claims, 8 Drawing Sheets

Related U.S. Application Data continuation of application No. 15/102,011, filed as application No. PCT/IB2014/066356 on Nov. 26, 2014, now Pat. No. 10,153,250.

(51) Int. Cl.

| | | |
|---|---|---|
| *H01L 23/367* | (2006.01) | |
| *H01L 23/00* | (2006.01) | |
| *H01L 21/48* | (2006.01) | |
| *H01L 23/498* | (2006.01) | |
| *H01L 23/373* | (2006.01) | |

(52) U.S. Cl.
CPC ...... *H01L 23/367* (2013.01); *H01L 23/49805* (2013.01); *H01L 24/10* (2013.01); *H01L 24/16* (2013.01); *H01L 24/81* (2013.01); *H01L 23/3736* (2013.01); *H01L 24/03* (2013.01); *H01L 24/08* (2013.01); *H01L 24/13* (2013.01); *H01L 2224/022* (2013.01); *H01L 2224/02135* (2013.01); *H01L 2224/02205* (2013.01); *H01L 2224/02215* (2013.01); *H01L 2224/10156* (2013.01); *H01L 2224/10165* (2013.01); *H01L 2224/10175* (2013.01); *H01L 2224/131* (2013.01); *H01L 2224/16145* (2013.01); *H01L 2224/16225* (2013.01); *H01L 2224/16237* (2013.01); *H01L 2224/16238* (2013.01); *H01L 2224/17181* (2013.01); *H01L 2224/32145* (2013.01); *H01L 2224/32225* (2013.01); *H01L 2224/33181* (2013.01); *H01L 2224/73204* (2013.01); *H01L 2224/81007* (2013.01); *H01L 2224/81009* (2013.01); *H01L 2224/81191* (2013.01); *H01L 2224/81907* (2013.01); *H01L 2225/06513* (2013.01); *H01L 2225/06517* (2013.01); *H01L 2225/06565* (2013.01); *H01L 2225/06589* (2013.01); *H01L 2924/014* (2013.01); *H01L 2924/15311* (2013.01)

(58) Field of Classification Search
CPC ......... H01L 24/10; H01L 24/16; H01L 24/81; H01L 2224/10125; H01L 2224/10126; H01L 2224/10135; H01L 2224/10145; H01L 2224/10156; H01L 2224/10165; H01L 2224/10175; H01L 2224/131; H01L 2224/16145; H01L 2224/16225; H01L 2224/16237; H01L 2224/16238; H01L 2224/17181; H01L 2224/32145; H01L 2224/32225; H01L 2224/33181; H01L 2224/73204; H01L 2224/81007; H01L 2224/81009; H01L 2224/81191; H01L 2224/81907; H01L 2225/06513; H01L 2225/06517; H01L 2225/06589
See application file for complete search history.

(56) References Cited

U.S. PATENT DOCUMENTS

| | | |
|---|---|---|
| 5,500,785 A | 3/1996 | Funada |
| 6,441,312 B1 | 8/2002 | Tanimura |
| 6,671,176 B1 | 12/2003 | Barcley |
| 6,709,898 B1 | 3/2004 | Quing et al. |
| 6,710,433 B2 | 3/2004 | Megahed |
| 7,064,279 B2 | 6/2006 | Meyer |
| 7,071,569 B2 | 7/2006 | Ho et al. |
| 7,101,781 B2 | 9/2006 | Ho |
| 7,315,085 B2 | 1/2008 | Liu |
| 7,476,965 B2 | 1/2009 | Vai |
| 7,667,473 B1 | 2/2010 | Conn |
| 7,838,988 B1 | 11/2010 | Gurrum |
| 7,851,344 B2 | 12/2010 | Kugler |
| 8,373,284 B2 | 2/2013 | Ogatsu |
| 8,664,760 B2 | 3/2014 | Yu |
| 8,742,577 B2 | 6/2014 | Jee |
| 8,772,913 B1 | 7/2014 | Muniandy et al. |
| 9,048,135 B2 | 6/2015 | Hwang |
| 9,318,453 B2 | 4/2016 | Aliane et al. |
| 9,474,166 B2 | 10/2016 | Nakazawa |
| 9,543,263 B2 | 1/2017 | Shih |
| 9,570,415 B2 | 2/2017 | Park |
| 9,691,676 B2 | 6/2017 | Kodama et al. |
| 10,153,250 B2 | 12/2018 | Oggioni et al. |
| 10,297,561 B1 | 5/2019 | Mayer |
| 10,600,750 B2 | 3/2020 | Mayer |
| 2002/0050380 A1 | 5/2002 | Hirotoshi et al. |
| 2002/0100973 A1 | 8/2002 | Akram et al. |
| 2004/0188123 A1 | 9/2004 | Peterson et al. |
| 2005/0013082 A1 | 1/2005 | Kawamoto et al. |
| 2005/0046006 A1 | 3/2005 | Yeom |
| 2007/0045804 A1 | 3/2007 | Lin |
| 2007/0262443 A1 | 11/2007 | Val |
| 2009/0032941 A1 | 2/2009 | McLellan |
| 2009/0101395 A1 | 4/2009 | Horikiri |
| 2009/0321914 A1 | 12/2009 | Ayotte et al. |
| 2010/0190333 A1 | 7/2010 | Park |
| 2010/0248424 A1 | 9/2010 | Luce |
| 2011/0300307 A1 | 12/2011 | Nakai |
| 2012/0181067 A1 | 7/2012 | Wen et al. |
| 2013/0134606 A1 | 5/2013 | Im et al. |
| 2014/0027920 A1 | 1/2014 | Kodama |
| 2014/0103522 A1 | 4/2014 | Takemoto |
| 2014/0376190 A1 | 12/2014 | Dean |
| 2015/0130020 A1 | 5/2015 | Shih |
| 2016/0049378 A1 | 2/2016 | Song |
| 2019/0043838 A1 | 2/2019 | Oggioni et al. |

FOREIGN PATENT DOCUMENTS

| | | |
|---|---|---|
| CN | 202495438 U | 10/2012 |
| JP | 2003-282778 A | 10/2003 |
| JP | 2003283144 A | 10/2003 |
| JP | 2004-111849 A | 4/2004 |
| JP | 2006-179606 A | 7/2006 |
| JP | 2007-123443 A | 5/2007 |
| JP | 2011-142185 A | 7/2011 |
| JP | 2012-216836 A | 11/2012 |
| JP | 2013-077689 A | 4/2013 |

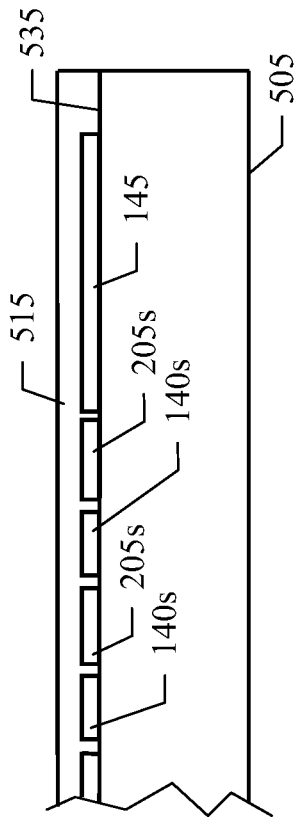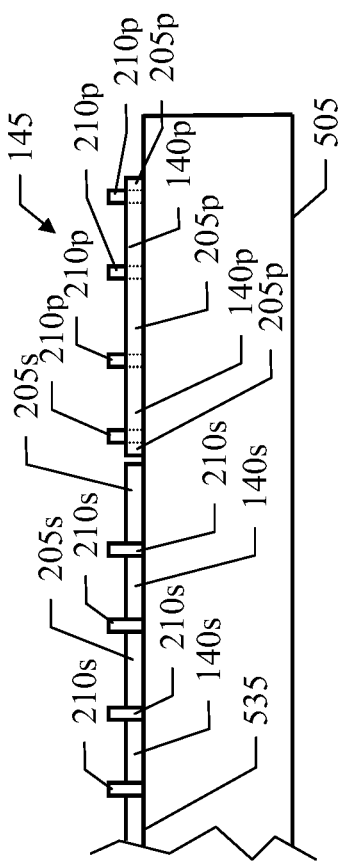
FIG. 5C
FIG. 5D
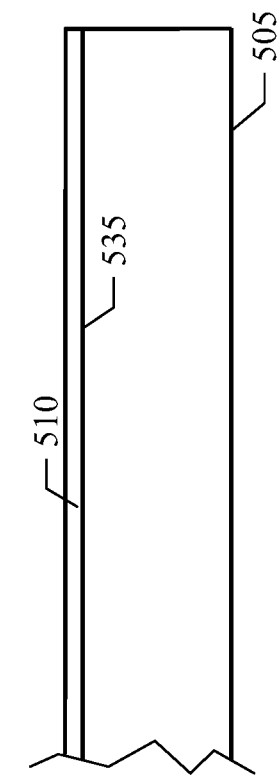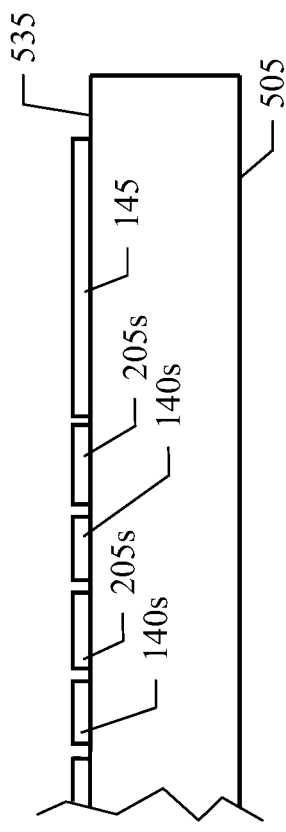
FIG. 5A
FIG. 5B

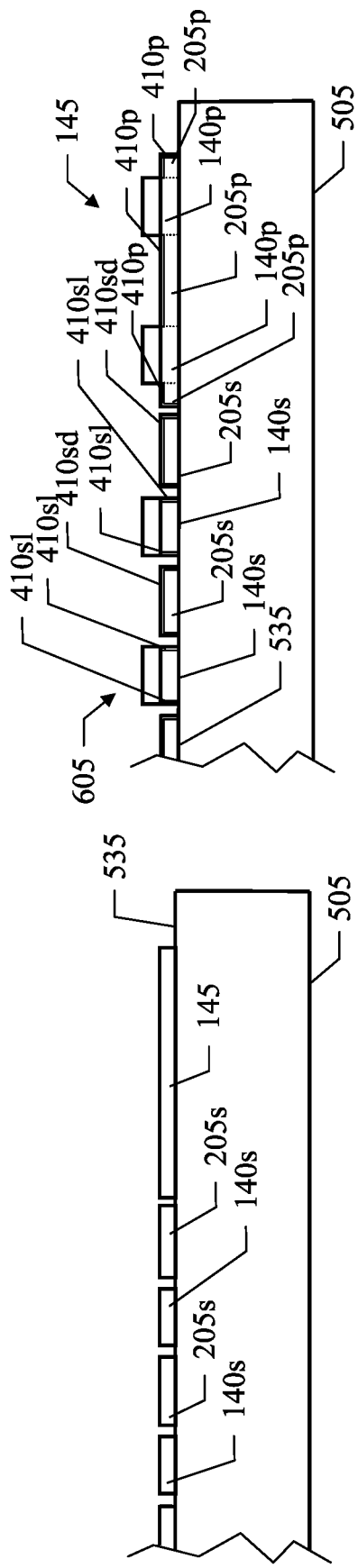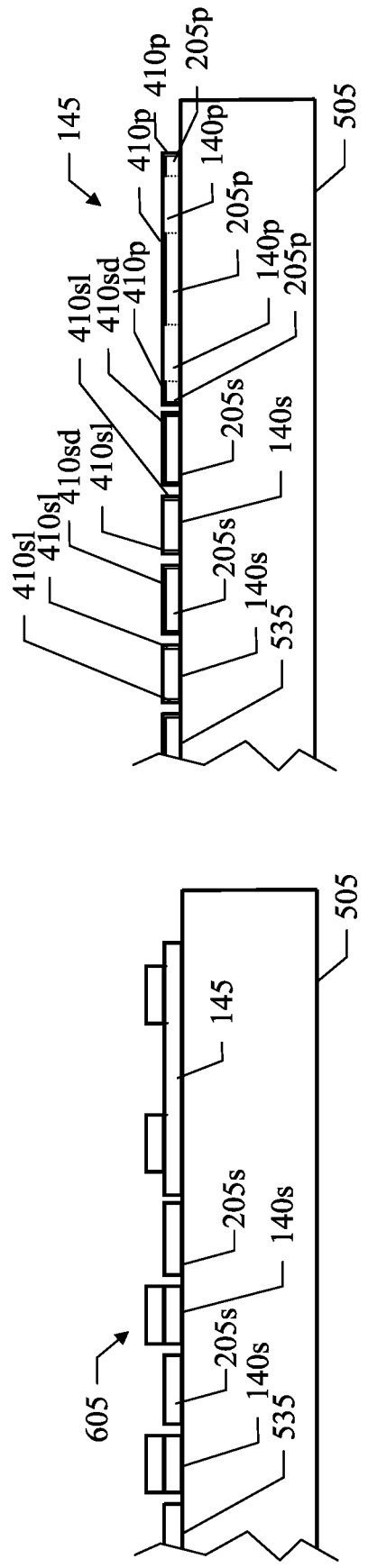

MANUFACTURING OF FLIP-CHIP ELECTRONIC DEVICE WITH CARRIER HAVING HEAT DISSIPATION ELEMENTS FREE OF SOLDER MASK

BACKGROUND

The present disclosure relates to the electronics field. More specifically, this disclosure relates to electronic devices based on flip-chip technology.

Electronic devices may include one or more electronic components, each one implemented by a (monolithic) Integrated Circuit (IC) on a corresponding chip (for example, of silicon). In these electronic devices, the chips may be mounted on (chip) carriers, so as to protect the chips from mechanical stresses and to connect them electrically. Each chip is provided with terminals for accessing its integrated circuit (i.e., for exchanging signals and receiving a power supply input). The terminals are connected to corresponding electrical contacts of the carrier that implement any input/output function of the electronic device, for example, in the form of a grid of balls in an electronic device of the Ball Grid Array (BGA) type.

Particularly, in electronic devices of the flip-chip type (also known as Controlled Collapse Chip Connection, C4) the chip is flipped to have an active (front) surface with its terminals facing corresponding lands of the carrier. The lands are arranged in a grid on a surface of the carrier (without any other electrically conductive material therebetween to limit any risk of short circuits), and they are generally connected to the electrical contacts arranged on an opposite surface of the carrier (for example, by means of through via-holes, or simply vias). The terminals are then directly soldered to the lands (i.e., by joining them with the addition of a solder material that melts without melting the adjoining parts). A space between the chip and the carrier is filled with a filler of electrically insulating material (for example, particle filled epoxy resin), so as to improve their mechanical connection and compensate for different thermal expansion coefficients.

Generally, a reflow soldering technique may be used to solder the terminals to the lands. Briefly, solder bumps are deposited on the terminals of the chip using one of the various techniques available in the industry (for example, evaporation, electroplating, screen printing). The solder bumps are brought into contact with the corresponding lands that may also be pre-treated with solder deposition, so as to attach to them temporarily (due to a tacky nature of a solder paste or of an added soldering flux agent). The assembly is heated up to melt the solder material contained in the solder bumps. The assembly is then cooled, hardening the solder material to create a solder connection between each terminal and the corresponding land. The above-mentioned soldering operation requires the use of a solder mask (or solder resist). The solder mask restrains the solder material, thereby limiting its spreading during the soldering, when it is at the liquid state (so as to prevent undefined wetting of the solder material on possible exposed conductors of the carrier and to prevent the formation of any solder bridges creating unintended short circuits). For this purpose, the solder mask includes a layer of insulating material that is distributed on the whole carrier (so as to ensure the required insulation function), with windows that are opened therein for exposing the lands only (so as to allow their soldering).

Different connection techniques are also known in the art for connecting the terminals to the electrical contacts. For example, in a wire-bonding technique the chip is mounted with a (back) inactive surface thereof on the carrier (so as to have its terminals facing away from the carrier); with each terminal being connected to the corresponding land by means of a wire of electrically conductive material that is soldered with its ends thereto. In this case as well, a solder mask is provided on the carrier to prevent the formation of any solder bridge (and to protect any possible exposed conductors against oxidation).

Generally, chips may be subject to heating in operation, especially when they involve the consumption of relatively high power (for example, of the order of 0.01-1 kW). Moreover, the heating of a chip may be not uniform, since it may concentrate in areas with more power demanding portions of its integrated circuit (for example, cores of microprocessors). The heat produced by the chip should be transferred to the external environment for its dissipation, in order to ensure the correct operation of the electronic device.

However, in an electronic device of the flip-chip type the heat dissipation effectiveness into or through the carrier may be not completely satisfactory (on the contrary of the electronic devices based on the wire-bonding technique wherein the inactive surface of the chip is attached to the carrier so that the heat may be transferred from the bulk of the chip to the carrier). Indeed, in this case the connection of the chip to the carrier has poor thermal conductivity. Particularly the heat transfer mainly occurs through the solder connections that have quite limited size (e.g., of the order of 15-25% of the active surface for a fully populated grid with lands whose diameter is half the solder connection pitch); conversely, the majority of the active surface of the chip is thermally insulated from the carrier (especially for chips with peripheral terminals only), since two additional bad heat conductors, i.e., the filler and the solder mask, are interposed between them. Fillers of thermal conductive material might also be used to improve the heat dissipation in-between the solder connections; however, the solder mask on the carrier still represents a thermal barrier hindering the heat dissipation.

Several applications would benefit from an improved heat dissipation into or through the carrier, for example, if not enough room is available to attach bulky heatsinks to the inactive surface of the chip to dissipate the heat or if the dissipation of the heat from both sides of the chip would allow using less sophisticated, and then cost effective, thermal materials and heatspreaders/heatsinks to ensure the required heat dissipation characteristics.

Conversely, the poor heat dissipation effectiveness of the electronic devices may adversely affect their performance and reliability (for example, in smart-phone applications). Moreover, it may require the use of sophisticated, and then expensive thermal materials to enhance the heat transfer.

SUMMARY

Provided herein, in one or more aspects is a method of manufacturing an electronic device of a flip-chip type. The method includes: forming one or more contact elements of electrically conductive material on a carrier surface of at least one chip carrier; providing a restrain structure around the contact elements; depositing solder material on the contact elements and/or on one or more terminals of electrically conductive material on a chip surface of at least one integrated circuit chip; placing the chip with each terminal facing a corresponding contact element; soldering each terminal to the corresponding contact element by a solder material, the solder material being restrained during a soldering of the terminals to the contact elements by the restrain structure; and forming one or more heat-dissipation elements of thermally conductive material on the carrier surface for facing the chip surface displaced from the terminals, the one or more heat-dissipation elements being free of any solder mask.

BRIEF DESCRIPTION OF THE DRAWINGS

Aspects of the present disclosure, as well as further features and the advantages thereof, will be best understood with reference to the following detailed description, provided by way of example only, to be read in conjunction with the accompanying drawings (wherein, for the sake of simplicity, corresponding elements are denoted with equal or similar references and their explanation is not repeated, and the name of each entity is generally used to denote both its type and its attributes—such as value, content and representation). In this respect, it is expressly intended that the figures are not necessary drawn to scale (with some details being exaggerated and/or simplified) and that, unless otherwise indicated, they are merely used to conceptually illustrate the structures and procedures described herein. By way of illustration:

FIGS. 5A-5D show by way of example a method for manufacturing an electronic device, according to one or more aspects of the present invention;

FIGS. 6A-6D show another embodiment of a process for manufacturing an electronic device, according to one or more aspects of the present invention;

DETAILED DESCRIPTION

A simplified summary of the present disclosure is herein presented in order to provide a basic understanding thereof; however, the sole purpose of this summary is to introduce some concepts of the disclosure in a simplified form as a prelude to its following more detailed description, and it is not to be interpreted as an identification of its key elements nor as a delineation of its scope.

In general terms, the present disclosure is based on the idea of providing heat dissipation elements on the chip carrier.

Particularly, one or more aspects of the present disclosure are set out in the independent claims and advantageous features thereof are set out in the dependent claims, with the wording of all the claims that is herein incorporated verbatim by reference (with any advantageous feature provided with reference to a specific aspect that applies mutatis mutandis to every other aspect).

More specifically, an aspect provides an electronic device of flip-chip type including at least one chip carrier, wherein the carrier has one or more heat dissipation elements (of thermally conductive material) that are free of any solder mask.

A further aspect provides a chip carrier for use in this electronic device.

A further aspect provides an integrated circuit chip for use in this electronic device.

A further aspect provides a corresponding manufacturing method.

Figure 1:
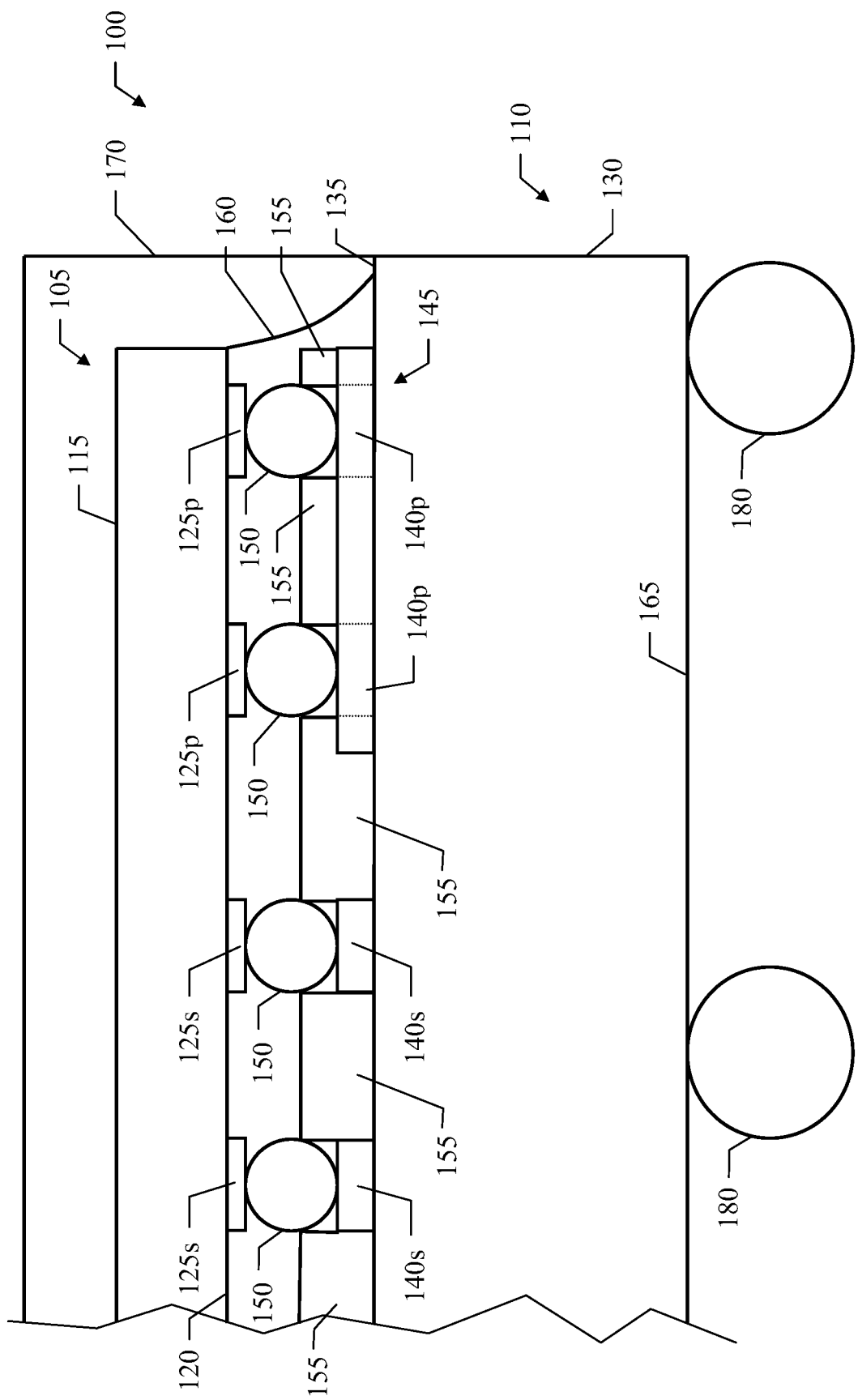
FIG. 1 shows a schematic cross-sectional side view of a portion of an electronic device to which one or more aspects of the present invention may be applied.

With reference to FIG. 1, a schematic cross-sectional side view is shown of a portion of an electronic device 100, to which one or more aspects according to the present disclosure may be applied.

The electronic device 100 is of the flip-chip type, wherein an integrated circuit chip, or simply chip, 105 (or more) is flipped and then directly connected to a chip carrier, or simply carrier, 110 (or more).

More specifically, the chip 105 comprises a die 115 of semiconductor material (for example, silicon with a size of the order of 5-20 mm×5-20 mm×0.5-2 mm), whereon a circuit implementing an electronic component (for example, a microprocessor) is integrated. The integrated circuit has a relatively high power consumption in operation (for example, of the order of 0.01-1 kW). One or more terminals of electrically conductive material (for example, pads of copper with a width of the order 50-100 μm) are exposed on a (chip active) surface 120 of the die 115 (typically covered with a protective layer of electrically insulating material, not shown in the figure, such as silicon oxide). The terminals are used to access the integrated circuit of the chip 105; particularly, some (signal) terminals, denoted with the reference 125$s$, are used to exchange signals (i.e., input/output electrical quantities processed by the integrated circuit according to its function) and some (power) terminals, denoted with the reference 125$p$, are used to receive a power supply of the chip 105 (i.e., a ground voltage and a supply voltage with reference thereto). The chip 105 has a relatively high number of terminals 125$s$, 125$p$ (for example, of the order of 2,000-30,000), which are arranged with a grid pattern on the surface 120 with a relatively low pitch (for example, of the order of 50-300 μm).

The carrier 110 comprises a circuitized substrate 130 (for example, a laminate of glass fiber, resin and metal with a size of the order of 10-70 mm×10-70 mm×1-3 mm). One or more contact elements of electrically conductive material (for example, lands of copper with a width of the order 50-100 μm) are exposed on a (carrier front) surface 135 of the substrate 130 (defined by a last layer of electrically insulating material). The contact elements are directly soldered to the terminals 125$s$, 125$p$. For instance, for the (signal) terminals 125$s$ the contact elements are in the form of distinct (signal) lands, denoted with the reference 140$s$, and for the (power) terminals 125$p$ the contact elements are in the form of (power) lands, denoted with the reference 140$p$, defined by corresponding portions of one or more distinct power rails 145 (identified by dotted lines in the figure). The terminals 125$s$, 125$p$ are soldered to the lands 140$s$, 140$p$ by means of corresponding solder bumps 150 of a solder material; for example, the solder bumps 150 are made of a solder paste, i.e., a mixture comprising a flux for cleaning the elements to be soldered, an adhesive for temporarily holding the elements before their soldering, and a solder powder for actually soldering the elements (for example, a tin-silver-copper alloy). For this purpose, a solder mask 155 is provided on the surface 135; the solder mask 155 is a layer of electrically insulating material (for example, epoxy resin) with openings for the solder bumps 150 (used to restrain them during the soldering). A filler 160 of electrically insulating material (for example, particle filled epoxy resin) fills a space between the chip 105 and the carrier 110 (to improve their mechanical connection and compensate their different thermal expansion coefficient). The lands 140s, 140p are connected to corresponding electrical contacts 180 of electrically conductive material (for example, copper), which electrical contacts 180 implement any input/output function of the electronic device 100; particularly, the electronic device 100 is of the BGA type, wherein the electrical contacts 180 comprise leads and balls arranged with a grid pattern on a (back carrier) surface 165 of the substrate 130, opposite the surface 135, which balls are connected to the lands 140s, 140p through vias and metal traces formed within the substrate 130 (not shown in the figure). The whole assembly is generally embedded in a case 170 of electrically insulating material, which protects the chip 105 from the external environment leaving exposed the electrical contacts 180 for its access.

Figure 2:
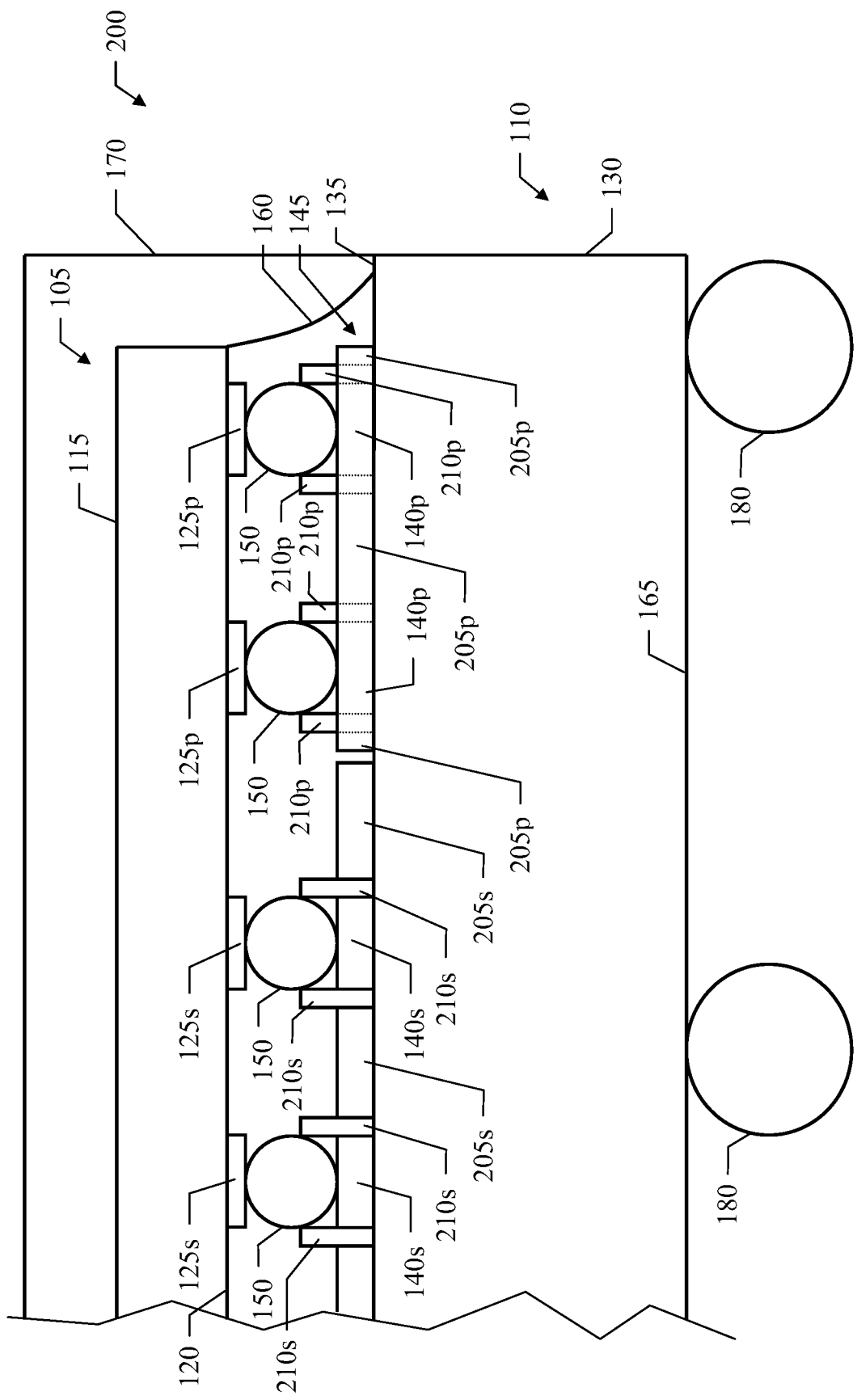
FIG. 2 shows a schematic cross-sectional side view of a portion of an electronic device, according to one or more aspects of the present invention.

With reference to FIG. 2, a schematic cross-sectional side view is shown of a portion of an electronic device 200 according to an embodiment of the present disclosure.

The electronic device 200 differs from the one described above in that one or more (heat) dissipation elements of thermally conductive material (for example, formed from a same metal layer of the lands 140s, 140p) are provided on the surface 135; the dissipation elements face the surface 120 of the die 115, but they are displaced from the terminals 125s, 125p; particularly, the dissipation elements are added among the lands 140s and the power rails 145, spaced apart from them (denoted with the reference 205s) and they are defined by the remaining portions of the power rails 145, which are not used by the lands 140p and are left free (denoted with the reference 205p).

Moreover, the solder mask is replaced by a different restrain structure (described in detail in the following), which is arranged around the lands 140s, 140p for restrain the solder bumps 150 during the soldering of the terminals 125s, 125p to the lands 140s, 140p; however, the restrain structure now leaves the dissipation elements 205s, 205p free of any solder mask.

The above-described structure significantly improves the heat dissipation effectiveness of the electronic device 200 into or through the carrier 110. Particularly, the dissipation elements 205s, 205p as well contribute to transfer the heat produced by the chip 105 in operation into the carrier 110 (to an extent that may be comparable to the one of the solder bumps 150) and/or through the carrier 110 (for example, by coupling each dissipation element 205s, 205p with one or more thermal vias formed in the carrier 110, not shown in the figure). As a result, the heating of the chip 105 and the concentration of the heat transfer at the solder bumps 150 is reduced. This has a beneficial effect on the performance and the reliability of the electronic device 200. Particularly, the improved heat dissipation into or through the carrier 110 may allow obtaining the required heat dissipation characteristics even when not enough room is available to attach bulky heatsinks to the inactive surface of the chip 105 to dissipate the heat or when less sophisticated, and then cost effective, thermal materials and heatspreaders/heatsinks are used. The above-mentioned advantages are clear when the electronic device 200 involves the consumption of relatively high power, especially when the heating of the chip 105 is not uniform since it concentrates in areas with more power demanding portions of its integrated circuit (for example, one or more cores of a microprocessor).

In the embodiment depicted, the restrain structure comprises one or more portions of a solder mask layer that is shaped to define corresponding rings; each ring is arranged around a corresponding land 140s, 140p; particularly, for the (signal) lands 140s the rings (denoted with the reference 210s) are arranged on a free portion of the surface 135 separating the lands 140s from the dissipation elements 205 (or from the power rail 145), and for the (power) lands 140p the rings (denoted with the reference 210p) are arranged on a surrounding portion of the power rail 145 (so as to define the corresponding dissipation element 205p, identified by dotted lines in the figure). The rings 201s, 210p are relatively thin; for example, the rings 201s, 210p have a width that is about 0.1-0.5 times, such as about 0.2-0.4 times, or about 0.25-0.35 times, such as about 0.3 times a diameter of the lands 140s, 104p (for example, of the order of 15-25 µm for lands 140s, 140p with a diameter of 45-75 µm and solder bumps with a pitch of 140-160 µm). This increases the extent of the dissipation elements 205s, 205p, and then their contribution to the transfer of the heat produced by the chip 105 into or through the carrier 110.

In one or more embodiments, the filler 160 is made of a thermally conductive (but always electrically insulating) material, for example, an epoxy resin filled with thermal conductive particles. Quantitatively, the filler 160 may have a thermal conductivity of the order of 0.01-10%, or more particularly, 0.25-5%, and still more particularly, 0.5-2% (such as 1%) of the thermal conductivity of the dissipation elements 205s, 205p (for example, in the range of 1-4 W/m-K for the filler 160 with respect to 340 W/m-K for the dissipation elements 205s, 205p made of copper). This further improves the capability of transferring the heat produced by the chip 105 to the outside through the carrier 110 (since it substantially limits the corresponding thermal interface).

Figure 3:
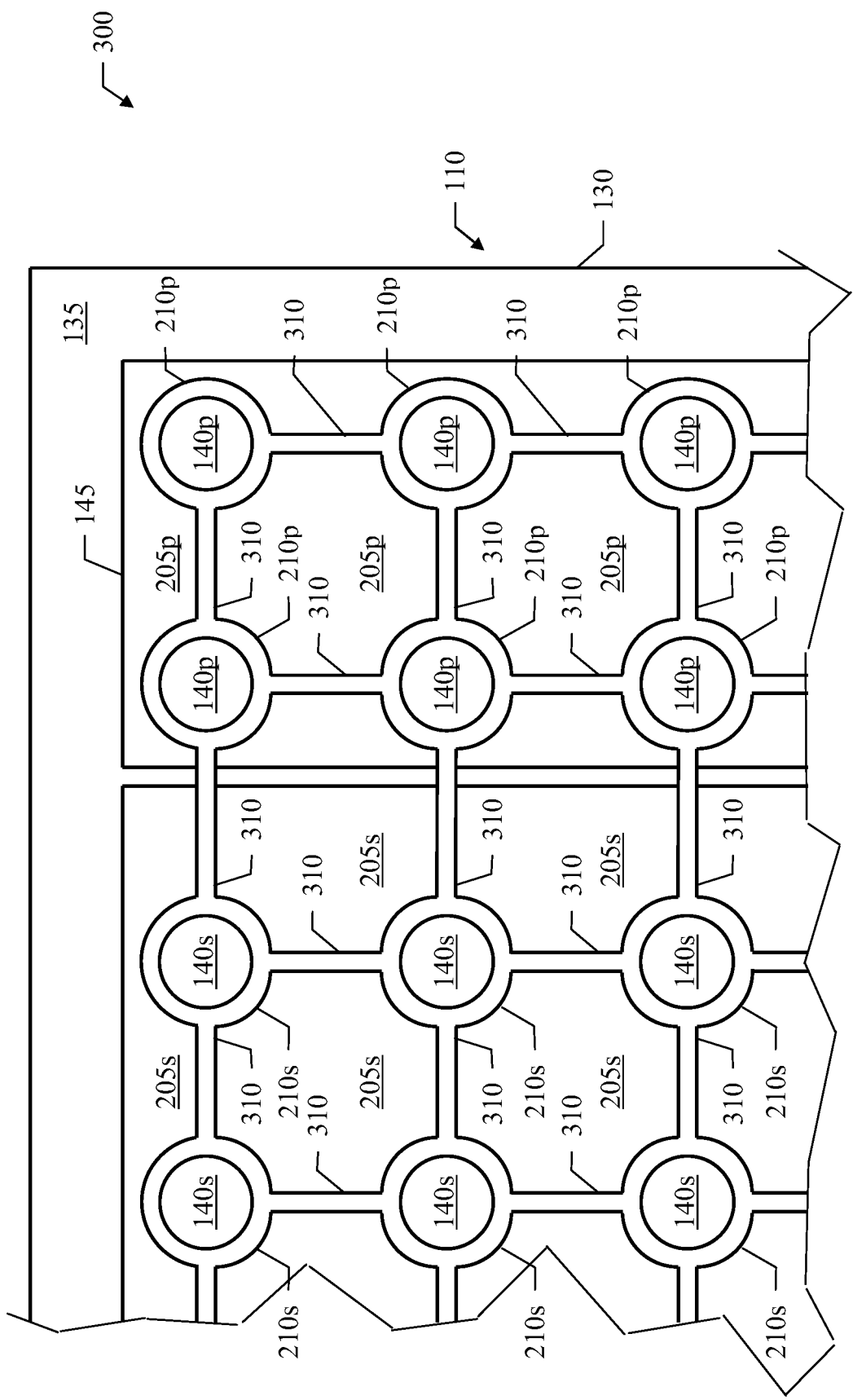
FIG. 3 shows a schematic cross-sectional top view of a portion of an electronic device, according to one or more aspects of the present invention.

With reference to FIG. 3, a schematic cross-sectional top view is shown depicting a portion of an electronic device 300, according to an embodiment of the present disclosure.

In this case, the restrain structure comprises one or more further portions of the same solder mask layer that is shaped to define corresponding tie-bars 310; each tie-bar 310 extends between a corresponding pair of adjacent rings 210s, 210p (on the surface 135 and/or on the power rail 145). The tie-bars 310 as well are relatively thin (for example, with a width of the same order of the width of the rings 210s, 210p).

The tie-bars 310 enforce the restraining action of the rings 210s, 210p on the solder bumps (not shown in the figure); moreover, they increase the adhesion of the whole restrain structure (formed by the rings 210s, 210p and the tie-bars 310). However, the webbing pattern of the restrain structure so obtained leaves exposed a large area with the dissipation elements 205s, 205p. Particularly, the size of the dissipation elements 205s, 205p may be substantially the same as the area of the lands 140s, 140p (for example, in both cases of the order of 10-30% of a footprint of the chip, not shown in the figure); therefore, the capability of transferring the heat produced by the chip to the outside into or through the carrier 110 is substantially unaffected by the addition of the tie-bars 310.

Figure 4:
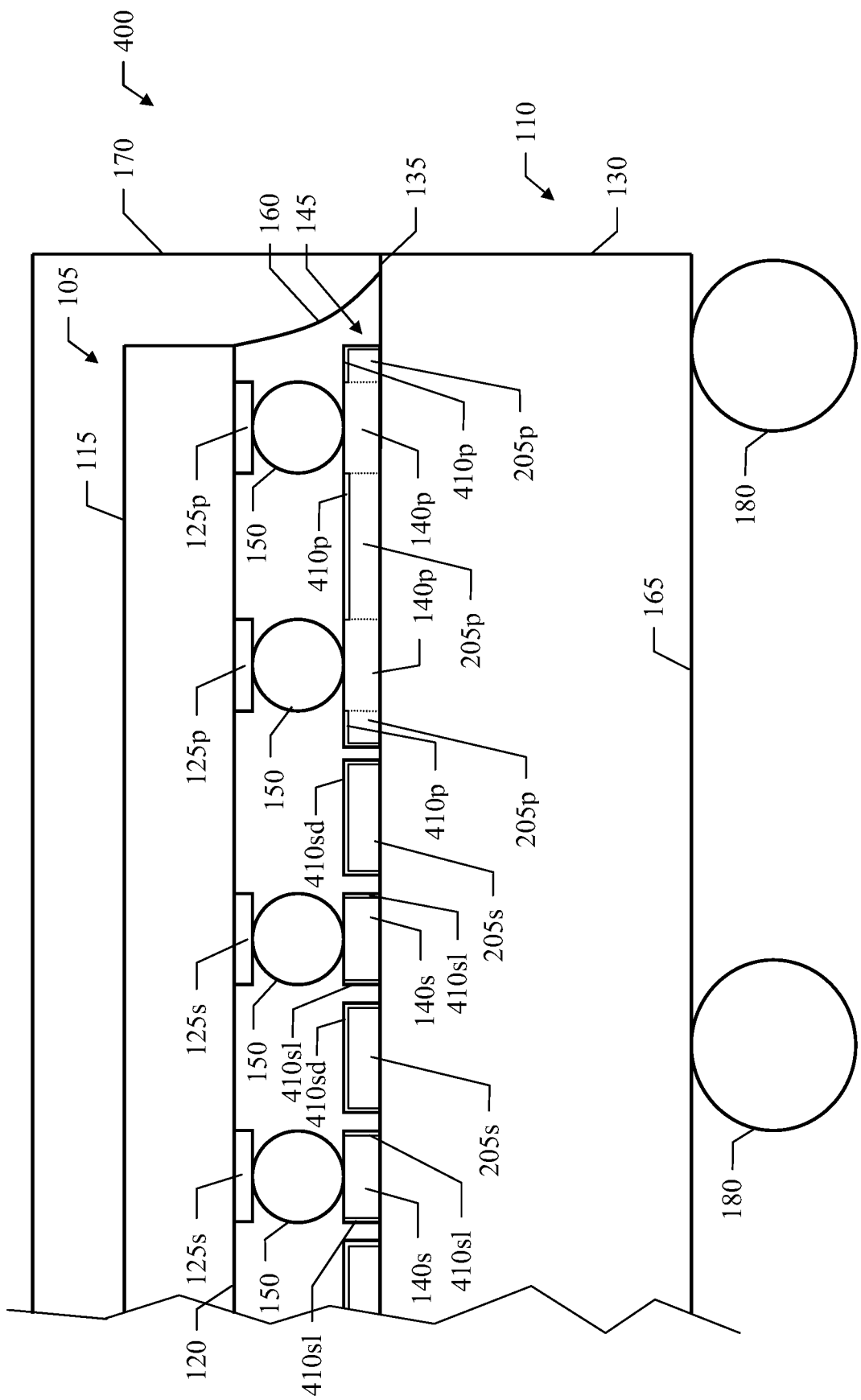
FIG. 4 shows a schematic cross-sectional side view of a portion of an electronic device, according to one or more aspects of the present invention.

With reference to FIG. 4, a schematic cross-sectional side view is shown of a portion of an electronic device 400 according to an embodiment of the present disclosure.

In this case, the restrain structure comprises one or more phobic surfaces of the dissipation elements 205s, 205p (or at least part thereof) that have been treated (for example, oxidized) so as to be phobic to the solder material; particularly, the phobic surfaces are the whole exposed surface of the dissipation elements 205s (denoted with the references 410sd), a lateral surface of the lands 140s (denoted with the references 410sl) and the whole exposed surface of the portion of the power rails 145 surrounding the lands 140p (denoted with the reference 410p). The phobic surfaces 410sd, 410sl, 410p prevent the solder bumps 150 from spreading over them (since the surface free energy of the solder bumps 150 to air interface at the liquid state is larger than the surface free energy of the phobic surfaces 410sd, 410sl, 410p to air interface). The phobic surfaces 410sd, 410sl, 410p provide a lower degree of wetting (wettability) to the solder material than the lands 140s, 140p do; for example, a contact angle (i.e., the angle measured through the liquid where a liquid-vapor interface meets a solid-liquid interface) of the phobic surfaces 410sd, 410sl, 410p is 2-10 times, or 3-8 times and still more particularly, 4-6 times, such as 5 times the contact angle of the lands 140s, 140p (for example, lower than 50°, such as lower than 20°, for the lands 140s, 140p and higher than 90° for the phobic surfaces 410sd, 410sl, 410p). The above-described structure further improves the capability of transferring the heat produced by the chip 105 to the outside into or through the carrier 110. Indeed, the lack of any solder mask removes the corresponding thermal interface. Conversely, the phobic surfaces 410sd, 410sl, 410p are better heat conductors than a solder mask is; for example, the phobic surfaces 410sd, 410sl, 410p may be made of inorganic materials, such as oxidized copper (instead of the typical polymeric materials of the solder mask), and they may be relatively thin (for example, with a thickness lower than 1 µm instead of the typical thickness higher than 10 µm of the solder mark).

With reference now to FIGS. 5A-5D, certain steps of a method for manufacturing an electronic device according to an embodiment of the present disclosure are shown; and particularly, the figures refer to the construction of the interface between the carriers and the chips to be mounted thereon.

Starting from FIG. 5A, a large panel 505 is provided, wherein the same structure (i.e., vias and traces) corresponding to multiple identical carriers is replicated in a large number (for example, hundreds). A metal layer 510 (for example, copper with a height of 10-30 µm) is deposited on an upper surface 535 of the large panel 505 (corresponding to the front surface of the carriers).

The metal layer 510 is patterned with standard photo-lithographic techniques (for example, by covering the metal layer 510 with a positive photo-resist layer, exposing the photo-resist layer to light through an optical mask only where the metal layer 510 has to be removed, developing the exposed photo-resist layer to dissolve it thereby obtaining a photo-resist mask, dry etching the metal layer 510 non-protected by the photo-resist mask, and then stripping the photo-resist mask).

As shown in FIG. 5B, this operation generates the (signal) lands 140s, the (signal) dissipation elements 205s and the power rails 145.

Passing to FIG. 5C, a solder mask layer 515 (for example, epoxy resin with a height of 20-40 µm) is deposited and planarized on the large panel structure so obtained (i.e., the surface 155, the lands 140s, the dissipation elements 205s and the power rails 145).

The solder mask layer 515 is patterned with standard photo-lithographic techniques. As shown in FIG. 5D, this operation generates the (signal) rings 210s around the lands 140s and the (power) rings 210p that define the (power) lands 140p and the dissipation elements 205p in the power rails 145 (identified by broken lines in the figure). During the same operation, it is also possible to form the tie-bars (not shown in the figure) among the rings 210s, 210p by suitably changing the patterning of the solder mask layer.

The manufacturing process then continues as usual using the large panel (or singularizing individual carriers prior of chip mounting). Particularly, a flux material is dispensed over chip mounting structures, so as to remove a native oxide layer from the exposed surfaces of the lands 140s, 104p (and the dissipation elements 205s, 205p), to prevent their further oxidation and to improve their wettability to the solder material. The chips with the solder bumps deposited on their terminals are placed over the large plate structure, with their active surface facing it and the solder bumps aligned with the corresponding lands 140s, 140p (with the solder bumps that remain attached to the lands 140s, 140p thanks to the tackiness of the solder material). The terminals are then soldered to the corresponding lands 140s, 140p with a reflow soldering technique (for example, in an oven with a pre-heating zone for preventing any damages to the components, a soak zone for activating the flux of the solder paste, a reflow zone for melting the solder powder of the solder past, and a cooling zone for solidifying the solder connections). Filler material is dispensed into the space between each chip and the large panel structure, and it is then cured to form the corresponding fillers. The electrical contacts of the corresponding electronic devices are formed on a lower surface of the large panel 505 (corresponding to the back surface of the carriers). At this point, the portions of the large panel structure corresponding to the different carriers are separated through a cutting operation. Each structure so obtained is embedded in the corresponding case (for example, by a molding operation) so as to obtain the corresponding electronic device of FIG. 2 (or of FIG. 3).

The above-described process is of general and ready applicability by any producer of electronic devices; indeed, this process may be implemented with standard process steps, by only changing the optical masks of the metal layer (for obtaining the dissipation elements) and of the solder mask layer (for obtaining the rings with the possible tie-bars).

With reference to FIGS. 6A-6D, certain steps are shown of a method for manufacturing an electronic device according to an embodiment of the present disclosure.

Starting from FIG. 6A, the same large panel structure of the FIG. 5B (with the lands 140s, the dissipation elements 205s and the power rails 145) is obtained as described above.

Moving to FIG. 6B, a photo-resist mask 605 is formed on the large panel structure with standard photo-lithographic techniques, so as to cover only the lands 140s and the portions of the power rails 145 wherein the corresponding power lands are to be defined. The photo-resist mask 605 is aligned with each (signal) land 140s, so as to cover an operative surface thereof (spaced apart from the surface 535), but leaving a lateral surface thereof (extending between the surface 535 and the operative surface) exposed.

Moving to FIG. 6C, the large plate structure is subject to a thermal oxidation process (for example, in open air at 150-500° C.) or to a wet-chemical oxidation process. This operation converts an external layer of the copper of the lands 140s, the dissipation elements 205s and the power rails 145 (which is not covered by the photo-resist mask 605) into a corresponding (functional) oxide layer; particularly, the functional oxide layer is formed on the whole surface of the dissipation elements 205s (so as to generate the corresponding phobic surfaces 410sd), on the lateral surface of the lands 140s (so as to generate the corresponding phobic surfaces 410sl), and on the exposed surface of the power rails 145 (so as to generate the corresponding phobic surfaces 410p). The oxidation process has a length (for example, of the order of 10-120 min.) sufficient to form the functional oxide with a thickness substantially higher than the one of a native oxide layer that forms spontaneously on the lands 140s,140p (at room temperature); for example, the functional oxide layer has a thickness that is 5-200 times, or 10-100 times, and still more particularly, 30-70 times, such as 50 times a thickness of the native oxide layer (for example, of the order of 50-300 nm).

At this point, the photo-resist mask 605 is stripped, as shown in FIG. 6D. The manufacturing process then continues as above, so as to obtain multiple pieces of the electronic device of FIG. 4. In this respect, it should be noted that the flux material that is dispensed over the chip mounting structures for removing the native oxide layer of the lands is substantially ineffective on the functional oxide layer because of its far higher thickness, so that this does not jeopardize the restrain action of the functional oxide layer on the solder material.

The above-described process is slightly more complex (since it requires the additional oxidation process), but it provides better heat dissipation effectiveness (due to the provision of a thin thermal conductive layer instead of any solder mask).

Figure 7:
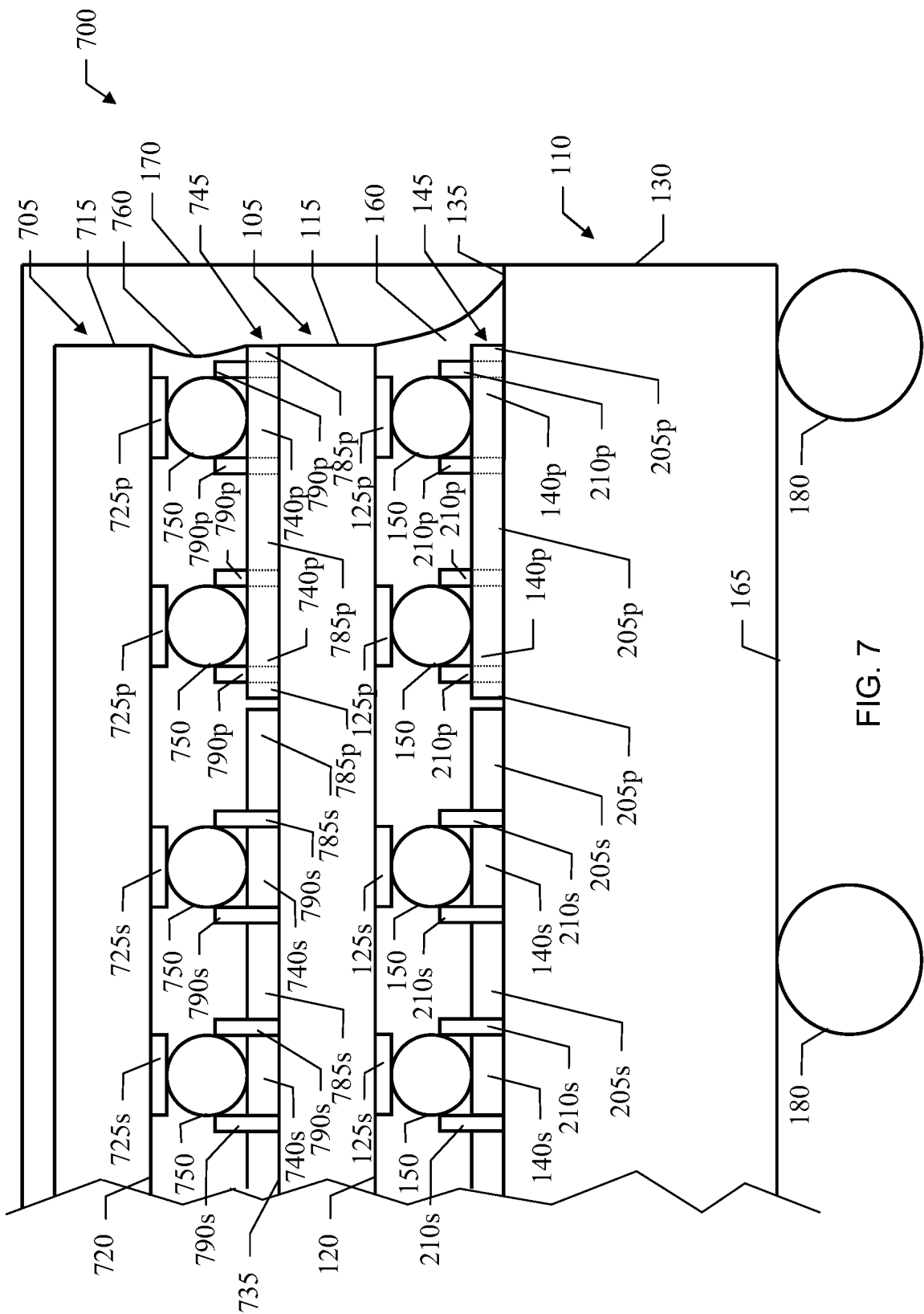
FIG. 7 shows a schematic cross-sectional side view of a portion of an electronic device, according to one or more aspects of the present invention.

With reference now to FIG. 7, a schematic cross-sectional side view is shown of a portion of an electronic device 700 according to an embodiment of the present disclosure.

In this case, the electronic device 700 comprises a further chip 705. As above, the chip 705 comprises a die 715 of semiconductor material, whereon a circuit implementing an electronic component (for example, a memory) is integrated. One or more terminals of electrically conductive material are exposed on a (chip active) surface 720 of the die 715, and particularly (signal) terminals 725s and (power) terminals 725p.

One or more contact elements of electrically conductive material are exposed on an additional (chip inactive) surface 735 of the die 115 (opposite the surface 120), and particularly (signal) lands 740s and (power) lands 740p (the latter defined by corresponding portions of one or more power rails 745). The terminals 725s, 725p are soldered to the lands 740s, 740p by means of corresponding (further) solder bumps 750 of a solder material. A filler 760 of electrically insulating (but thermally conductive in one or more embodiments) material fills a space between the chip 705 and the chip 105. Some of the lands 740s, 740p may also be connected to corresponding terminals 125s, 125p, and then to the electrical contacts 180 of the carrier 110 (for example, through vias and metal traces formed within the die 115, not shown in the figure).

In this case as well, one or more dissipation elements of thermally conductive material are provided on the surface 735 (facing the surface 720 of the die 715, but displaced from its terminals 725s, 725p), and particularly (signal) dissipation elements 785s and (power) dissipation elements 785p. Moreover, a restrain structure is arranged around the lands 740s, 740p for restrain the solder bumps 750 during the soldering of the terminals 725s, 725p to the lands 740s, 740p (leaving the dissipation elements 785s, 785p free of any solder mask). In the embodiment depicted, the restrain structure comprises one or more portions of a solder mask layer that is shaped to define corresponding rings, and particularly (signal) rings 790s each one arranged around a corresponding land 740s and (power) rings 790p each one arranged around a corresponding land 740p (for instance, connected to each other by tie-bars of the same solder mask layer, not shown in the figure). Similar considerations apply if the restrain structure comprises one or more phobic surfaces (not shown in the figure) of the dissipation elements 785s, 785p (or at least part thereof) that have been treated (for example, oxidized) so as to be phobic to the solder material.

In this way, it is possible to obtain a 3-dimensional (3-D) stack (with the same structure that may be replicated with the addition of one or more further chips and/or carriers); and this provides a high compactness of the electronic device 700. At the same time, the structure maintains an acceptable heat dissipation effectiveness (especially for the intermediate chips that are sandwiched between other chips/carriers).

Figure 8:
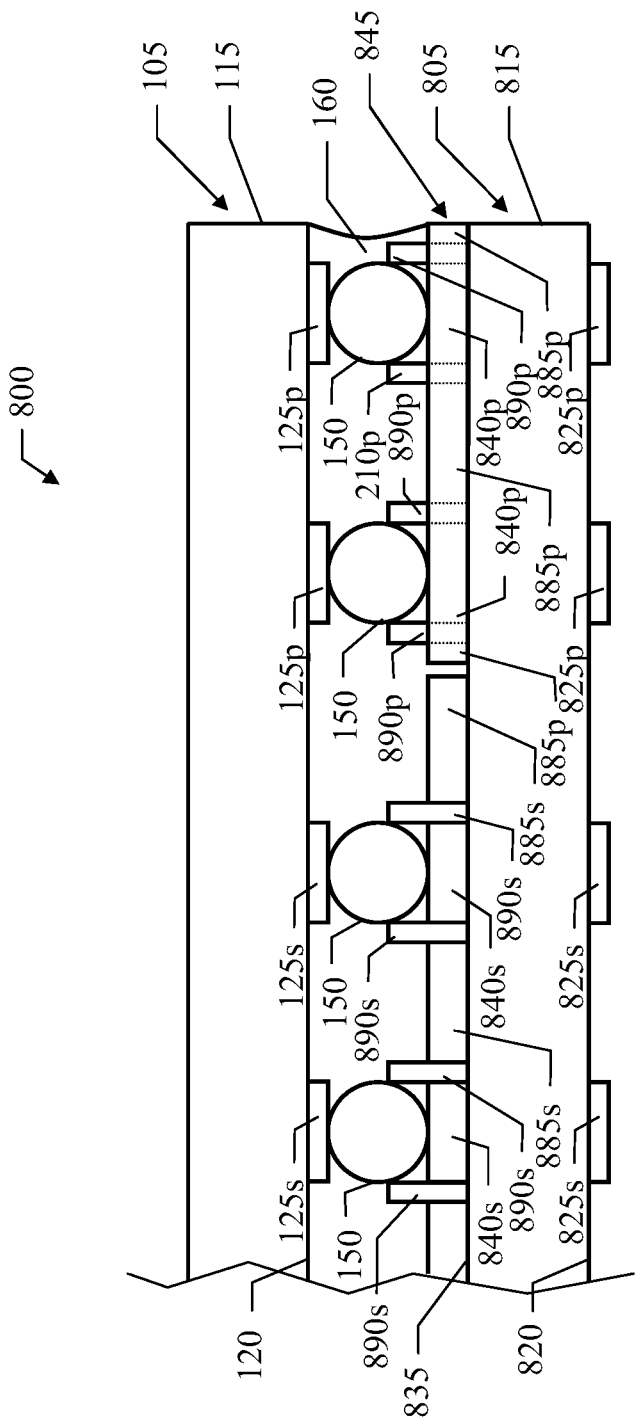
FIG. 8 shows a schematic cross-sectional side view of a portion of an electronic device, according to one or more aspects of the present invention.

With reference to FIG. 8, a schematic cross-sectional side view is shown of a portion of an electronic device 800 according to an embodiment of the present disclosure.

In this case, the carrier is implemented by a further chip 805. As above, the chip 805 comprises a die 815 of semiconductor material, whereon a circuit implementing an electronic component (for example, a voltage regulator) is integrated. One or more terminals of electrically conductive material are exposed on a (chip active) surface 820 of the die 815, and particularly (signal) terminals 825s and (power) terminals 825p.

One or more contact elements of electrically conductive material are exposed on an additional (chip inactive) surface 835 of the die 815 (opposite the surface 820), and particularly (signal) lands 840s and (power) lands 840p (the latter defined by corresponding portions of one or more power rails 845). Some of the lands 840s, 840p may also be connected to corresponding terminals 825s, 825p (for example, through vias and metal traces formed within the die 815, not shown in the figure).

In this case as well, one or more dissipation elements of thermally conductive material are provided on the surface 835 (facing the surface 120 of the die 115, but displaced from its terminals 125s, 125p), and particularly (signal) dissipation elements 885s and (power) dissipation elements 885p. Moreover, a restrain structure is arranged around the lands 840s, 840p for restrain the solder bumps 150 during the soldering of the terminals 125s, 125p to the lands 840s, 840p (leaving the dissipation elements 885s, 885p free of any solder mask). In the specific embodiment at issue, the restrain structure comprises one or more portions of a solder mask layer that is shaped to define corresponding rings, and particularly (signal) rings 890s each one arranged around a corresponding land 840s and (power) rings 890p each one arranged around a corresponding land 840p (for instance, connected to each other by tie-bars of the same solder mask layer, not shown in the figure). Similar considerations apply if the restrain structure comprises one or more phobic surfaces (not shown in the figure) of the dissipation elements 885s, 885p (or at least part thereof) that have been treated (for example, oxidized) so as to be phobic to the solder material.

In this case as well, it is possible to obtain a 3-D stack (with the same structure that may be replicated with the addition of one or more further chips) without the use of any carrier (for example, for naked-chip applications without any case), which 3-D stack is compact and has acceptable heat dissipation effectiveness.

Naturally, in order to satisfy local and specific requirements, a person skilled in the art may apply many logical and/or physical modifications and alterations to the present disclosure. More specifically, although this disclosure has been described with a certain degree of particularity with reference to one or more embodiments thereof, it should be understood that various omissions, substitutions and changes in the form and details as well as other embodiments are possible. Particularly, different embodiments of the present disclosure may even be practiced without the specific details (such as the numerical values) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the present disclosure may be incorporated in any other embodiment as a matter of general design choice. In any case, ordinal or other qualifiers are merely used as labels to distinguish elements with the same name but do not by themselves connote any priority, precedence or order. Moreover, the terms include, comprise, have, contain and involve (and any forms thereof) should be intended with an open, non-exhaustive meaning (i.e., not limited to the recited items), the terms based on, dependent on, according to, function of (and any forms thereof) should be intended as a non-exclusive relationship (i.e., with possible further variables involved), and the term a/an should be intended as one or more items (unless expressly indicated otherwise).

For example, an embodiment provides an electronic device of flip-chip type. The electronic device comprises at least one chip carrier, which has a carrier surface; the carrier comprises one or more contact elements of electrically conductive material on the carrier surface. The electronic device comprises at least one integrated circuit chip, which has a chip surface; the chip comprises one or more terminals of electrically conductive material on the chip surface, each one facing a corresponding contact element. Solder material solders each terminal to the corresponding contact element. Restrain means is provided around the contact elements for restraining the solder material during a soldering of the terminals to the contact elements. The carrier comprises one or more heat dissipation elements of thermally conductive material on the carrier surface, which face the chip surface displaced from the terminals; the dissipation elements are free of any solder mask.

However, the electronic device may be of any type (for example, CSP). Particularly, the carrier may be of any type (for example, with any type and number of thermal vias for each heat dissipation element, down to none), material and size (for example, lead-less), with contact elements of any type, shape, size, at any position and in any number; in any case, the carrier has to be intended in the broadest sense of the term as any component adapted to support one or more chips (comprising chip carriers in the strict sense, mounting boards, other chips). Likewise, the chip may be of any type, material and size (for example, a DAC), with terminals of any type, shape, size, at any position and in any number. The electronic device may comprise any number of carriers and chips. The solder material may of any type (for example, a lead-free alloy). The restrain means may be implemented in several different ways (see below). The dissipation elements may be of any type, shape, size, at any position and in any number (for example, always separated from the contact elements). The dissipation elements are free of any type of solder mask (i.e., a layer of insulating material of any type that is instead commonly used to protect conductive traces from oxidation and to prevent solder material from bridging between conductors during the soldering, for example, conforming to the requirements set out in the standard IPC-SM-840).

In an embodiment, the contact elements and the dissipation elements are portions of a common metal layer.

However, the contact elements and the dissipation elements may be of any electrically conductive material and any thermally conductive material, respectively, even non-metallic and different to each other (for example, aluminum).

In an embodiment, the restrain means comprises one or more portions of a solder mask layer, which is shaped to define one or more rings each one around a corresponding contact element.

However, the rings may be formed of any electrically insulating material, and they may have any shape and size.

In an embodiment, the restrain means comprises one or more further portions of the solder mask layer, which is shaped to define one or more tie-bars each one extending between a corresponding pair of adjacent rings.

However, the tie-bars may have any shape and size, and they may be arranged in any position. In any case, the possibility of making the tie-bars of a different material or of omitting them at all is not excluded (for example, when the rings are larger and then with a higher adhesion).

In an embodiment, the restrain means comprises one or more phobic surfaces of at least part of each dissipation element, which are treated to be phobic to the solder material.

However, the phobic surfaces may have any shape, size, and they may be at any position and in any number. For example, it is possible to form the phobic surfaces only around the contact elements; this provides better heat dissipation effectiveness, since the untreated surfaces of the dissipation elements are better heat conductors than the phobic surfaces are (but at the cost of a more accurate masking operation for the formation of the phobic surfaces). Moreover, the dissipation elements may be treated in any way to obtain the phobic surfaces (see below).

In an embodiment, each contact element has an operative surface that faces the corresponding terminal (spaced apart from the carrier surface), and a lateral surface that extends between the carrier surface and the operative surface; the restrain means comprises one or more further phobic surfaces of at least part of the lateral surface of each contact element, which are treated to be phobic to the solder material.

However, as above the further phobic surfaces may have any shape, size, and they may be at any position and in any number; moreover, they may be obtained by treating the contact elements in any way, even different from the one of the phobic surfaces (see below). In any case, the above-mentioned feature may also be omitted; in this case, the accuracy of the masking operation required to form the phobic surfaces may be relaxed, since a corresponding mask may extend beyond a border of the contact elements without the need of being aligned thereto any longer (but at the cost of a reduced restrain action on the solder material).

In an embodiment, each phobic surface is an oxidized surface and/or each further phobic surface is a further oxidized surface.

However, the oxidized surfaces may have any thickness; in any case, other treatments of the phobic surfaces, of the further phobic surfaces or of both of them are not excluded (for example, by plating them with other metals, derivatives, compounds or composites).

More generally, different, additional or alternative implementations of the restrain structure are possible. For example, it is possible to combine the rings (with or without the tie-bars) with the phobic surfaces (with or without the further phobic surfaces). Particularly, in an embodiment the oxidized surfaces are formed only where the rings (and the possible tie-bars) are arranged. In this way, the oxidized surfaces increase the adhesion of the rings (and the tie-bars), thereby allowing reducing their width and/or removing the tie-bars; at the same time, the other (free) portions of the dissipation elements are not oxidized, and then they are better heat conductors (but at the cost of a more accurate masking operation for the oxidation process).

In an embodiment, the electronic device further comprises a filler of thermally conductive material, which fills a space between the carrier and the chip.

However, the filler may be of any material, even non-thermally conductive (for example, standard epoxy resin), or it may also be omitted at all.

In an embodiment, each chip has an additional chip surface opposite the chip surface; the chip comprises one or more further contact elements of electrically conductive material on the additional chip surface. The electronic device further comprises at least one further integrated circuit chip, which has a further chip surface; the further chip comprises one or more further terminals of electrically conductive material on the further chip surface, each one facing a corresponding further contact element. Further solder material solders each further terminal to the corresponding further contact element. Further restrain means is provided around the further contact elements for restraining the further solder material during a soldering of the further terminals to the further contact elements. The chip comprises one or more further heat dissipation elements of thermally conductive material on the additional chip surface, which face the further chip surface displaced from the further terminals; the further dissipation elements are free of any solder mask.

In addition or in alternative, in an embodiment the carrier is a still further integrated circuit chip.

However, the further chip and the still further chip may be of any type, material and size, with terminals/contact elements of any type, shape, size, at any position and in any number (either the same as or different from the chip/carrier). Moreover, the same additional features described above may be applied in the same way in this case as well. More generally, the electronic device may comprise any number of carriers and/or chips, in any combination.

Another embodiment provides a chip carrier for use in the above-described electronic device; the carrier has a carrier surface and comprises one or more contact elements of electrically conductive material on the carrier surface, restrain means around the contact elements for restraining solder material during a soldering of terminals of at least one chip to the contact elements, and one or more heat dissipation elements of thermally conductive material on the carrier surface, the dissipation elements being free of any solder mask.

Another embodiment provides an integrated circuit chip for use in this electronic device. The chip has a chip surface and an additional chip surface opposite the chip surface; the chip comprises one or more terminals of electrically conductive material on the chip surface, one or more contact elements of electrically conductive material on the additional chip surface, restrain means around the contact elements for restraining solder material during a soldering of terminals of at least one other chip to the contact elements, and one or more heat dissipation elements of thermally conductive material on the additional chip surface, the dissipation elements being free of any solder mask.

Generally, similar considerations apply if the electronic device, the chip carrier and the chip each has a different structure or comprises equivalent components (for example, of different materials), or it has other operative characteristics. In any case, every component thereof may be separated into more elements, or two or more components may be combined together into a single element; moreover, each component may be replicated to support the execution of the corresponding operations in parallel. Moreover, unless specified otherwise, any interaction between different components generally does not need to be continuous, and it may be either direct or indirect through one or more intermediaries.

Another embodiment provides a method for manufacturing an electronic device of flip-chip type. The method comprises the following steps. One or more contact elements of electrically conductive material are formed on a carrier surface of at least one chip carrier. Restrain means is formed around the contact elements. Solder material is deposited on the contact elements and/or on one or more terminals of electrically conductive material on a chip surface of at least one integrated circuit chip. The chip is placed with each terminal facing a corresponding contact element. Each terminal is soldered to the corresponding contact element by a solder material (with the solder material that is restrained during a soldering of the terminals to the contact elements by the restrain means). One or more heat dissipation elements of thermally conductive material are formed on the carrier surface for facing the chip surface displaced from the terminals; the dissipation elements are free of any solder mask.

However, the method may be performed at any level (on one or more carriers in a large plate or already singularized and/or on one or more chips in a wafer or already singularized); the terminals may be soldered to the contact elements in any way (for example, by depositing the solder material on the terminals, on the contact elements or on both of them, which solder material is then melted in any way, such as with infrared lamps). The contact elements, the dissipation elements and the restrain means may be formed in any way (see below).

In an embodiment, the forming one or more contact elements and the forming one or more heat dissipation elements comprise depositing a common metal layer, and patterning the common metal layer into portions defining the contact elements and the dissipation elements.

However, the common metal layer may be patterned in any way (for example, with a lift-off technique); moreover, it is possible to deposit the metal layer selectively to form the contact elements and the dissipation elements directly. In any case, the possibility of repeating the same operations with different metal layers (for the contact elements and for the dissipation elements, respectively) is not excluded.

In an embodiment, the forming restrain means comprises depositing a solder mask layer, and patterning the solder mask layer to define one or more rings each one around a corresponding contact element.

However, in this case as well the solder mask layer may be patterned in any way or it may be deposited selectively.

In an embodiment, said forming restrain means comprises patterning the solder mask layer to define one or more tie-bars each one extending between a corresponding pair of adjacent rings.

However, similar considerations as above apply in this case as well.

In an embodiment, the forming restrain means comprises treating at least part of each dissipation element to obtain one or more phobic surfaces being phobic to the solder material.

However, the dissipation elements may be treated in any way to obtain the phobic surfaces (see above).

In an embodiment, the forming restrain means comprises treating at least part of a lateral surface of each contact element, extending between the carrier surface and an operative surface of the contact element facing the corresponding terminal being spaced apart from the carrier surface, to obtain one or more further phobic surfaces being phobic to the solder material.

However, the contact elements may be treated in any way to obtain the further phobic surfaces (see above).

In an embodiment, the treating at least part of each dissipation element and the treating at least part of a lateral surface of each contact element comprise oxidizing at least part of each dissipation element and oxidizing at least part of the lateral surface of each contact element, respectively.

However, the oxidation operation may be performed in any way (for example, at different temperature, in a different atmosphere).

In an embodiment, the method further comprises filling a space between the carrier and the chip with a filler of thermally conductive material.

However, the filler may be provided in any way (for example, by curing it with or without the addition of hardeners and/or accelerators); moreover, the filler may be of any other material and it may also be omitted (see above).

In an embodiment, the method further comprises the following steps. Further restrain means is formed around one or more further contact elements of electrically conductive material on an additional chip surface of each chip opposite the chip surface. Further solder material is deposited on the further contact elements and/or on one or more further terminals of electrically conductive material on a further chip surface of at least one further integrated circuit chip. The further chip is placed with each further terminal facing a corresponding further contact element. Each further terminal is soldered to the corresponding further contact element (with the further solder material that is restrained during a soldering of the further terminals to the further contact elements by the further restrain means). One or more further heat dissipation elements of thermally conductive material are formed on the additional chip surface for facing the further chip surface displaced from the further terminals; the further dissipation elements are free of any solder mask.

In addition or in alternative, in an embodiment the carrier is a still further integrated circuit chip.

However, the above-mentioned steps may be reiterated any number of times in any combination (with the same additional features described above that may be applied in the same way in this case as well).

More generally, the electronic device may be manufactured with different technologies, with masks being different in number and in type, or with other process parameters. Particularly, similar considerations apply if the same solution is implemented with an equivalent method (by using similar steps with the same functions of more steps or portions thereof, removing some steps being non-essential, or adding further optional steps); moreover, the steps may be performed in a different order, concurrently or in an interleaved way (at least in part).

What is claimed is:

1. A method for manufacturing an electronic device of flip-chip type comprising:
    forming one or more contact elements of electrically conductive material on a carrier surface of at least one chip carrier;
    providing a restrain structure around the contact elements;
    depositing solder material on the contact elements and/or on one or more terminals of electrically conductive material on a chip surface of at least one integrated circuit chip;
    placing the chip with each terminal facing a corresponding contact element;
    soldering each terminal to the corresponding contact element by a solder material, the solder material being restrained during a soldering of the terminals to the contact elements by the restrain structure; and
    forming one or more heat dissipation elements of thermally conductive material on the carrier surface for facing the chip surface displaced from the terminals, the one or more heat dissipation elements contacting the restrain structure around the contact elements and being free of any solder mask.

2. The method according to claim 1, wherein the forming one or more contact elements and the forming one or more heat dissipation elements comprise:
    depositing a common metal layer; and
    patterning the common metal layer into portions defining the one or more contact elements and the one or more dissipation elements.

3. The method according to claim 1, wherein forming the restrain structure comprises:
    depositing a solder mask layer; and
    patterning the solder mask layer to define one or more rings, each ring being around a corresponding contact element.

4. The method according to claim 3, wherein forming the restrain structure comprises:
    patterning the solder mask layer to define one or more tie-bars, each one extending between a corresponding pair of adjacent rings.

5. The method according to claim 1, wherein forming the one or more heat dissipation elements of thermally conductive material comprises providing the one or more heat dissipation elements to surround the restrain structure around the contact elements.

6. The method according to claim 1, further comprising providing a filler of thermally conductive material filling a space between the at least one chip carrier and the at least one integrated circuit chip.

7. The method according to claim 1, wherein forming the one or more contact elements comprises forming one or more signal contact elements of the electrically conductive material on the carrier surface, and one or more power contact elements of electrically conductive material on the carrier surface defined by corresponding portions of one or more distinct power rails on the carrier surface, and wherein depositing solder material comprises depositing solder material on one or more signal terminals of the electrically conductive material on the chip surface, each one facing a corresponding signal contact element, and depositing solder material on one or more power terminals of electrically conductive material on the chip surface, each one facing a corresponding power contact element.

8. The method according to claim 7, wherein each signal contact element has an operative land facing the corresponding signal terminal of the at least one integrated circuit chip and spaced apart from the carrier surface, and has a side surface extending between the carrier surface on which the signal contact element resides and the operative land of the signal contact element facing the corresponding signal terminal, the restrain structure comprising one or more phobic surfaces at the side surface of each signal contact element treated to be phobic to the solder material and not at the operative land of the signal contact element facing the corresponding signal element, the operative land of the signal contact element being an upper surface of the signal terminal.

9. The method according to claim 8, wherein a power contact element of the one or more contact elements includes an operative land defined in a portion of an upper surface of a distinct power rail of the one or more distinct power rails on the carrier surface, the restrain structure comprises one or more phobic surfaces at an exposed surface of the distinct power rail, including exposed portions of the distinct power rail surrounding the operative land defined in the portion of the upper surface of the distinct power rail.

10. A method for manufacturing an electronic device of flip-chip type comprising:
   forming one or more contact elements of electrically conductive material on a carrier surface of at least one chip carrier;
   providing a restrain structure around the contact elements;
   depositing solder material on the contact elements and/or on one or more terminals of electrically conductive material on a chip surface of at least one integrated circuit chip;
   placing the chip with each terminal facing a corresponding contact element;
   soldering each terminal to the corresponding contact element by a solder material, the solder material being restrained during a soldering of the terminals to the contact elements by the restrain structure;
   forming one or more heat dissipation elements of thermally conductive material on the carrier surface for facing the chip surface displaced from the terminals, the one or more heat dissipation elements being free of any solder mask; and
   wherein forming the restrain structure comprises:
      treating, by oxidizing, at least part of each dissipation element to obtain one or more phobic surfaces to the solder material.

11. The method according to claim 10, wherein forming the restrain structure comprises:
   treating, by oxidizing, at least part of a lateral surface of each contact element, extending between the carrier surface and an operative surface of the contact element facing the corresponding terminal spaced apart from the carrier surface, to obtain one or more further phobic surfaces to the solder material.

* * * * *